United States Patent
Lai et al.

(10) Patent No.: US 11,374,144 B2
(45) Date of Patent: Jun. 28, 2022

(54) METHOD FOR RECOVERING RESOURCE FROM CIGS THIN-FILM SOLAR CELL

(71) Applicant: National Tsing Hua University, Hsinchu (TW)

(72) Inventors: Chih-Huang Lai, Hsinchu (TW); Wei-Sheng Chen, New Taipei (TW); Yu-Lun Chueh, Hsinchu (TW); Fan-Wei Liu, Taichung (TW); Tzu-Ming Cheng, Tainan (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 140 days.

(21) Appl. No.: 17/078,306

(22) Filed: Oct. 23, 2020

(65) Prior Publication Data
US 2022/0052220 A1 Feb. 17, 2022

(30) Foreign Application Priority Data
Aug. 14, 2020 (TW) .................. 109127681

(51) Int. Cl.
*H01L 31/18* (2006.01)
*H01L 31/0224* (2006.01)
(Continued)

(52) U.S. Cl.
CPC .............. *H01L 31/18* (2013.01); *B09B 3/80* (2022.01); *B32B 43/006* (2013.01); *C01G 3/02* (2013.01);
(Continued)

(58) Field of Classification Search
CPC ............ B32B 2317/12; B32B 2311/00; B32B 43/006; B32B 2315/08; B32B 2310/0409; B32B 2457/12; B32B 2315/02; H01L 31/022425; H01L 31/0322; H01L 31/0445; H01L 31/18; C01G 15/00; C01G 3/02; B09B 3/80
See application file for complete search history.

(56) References Cited

U.S. PATENT DOCUMENTS

| | | | |
|---|---|---|---|
| 2003/0000568 A1* | 1/2003 | Gonsiorawski | H01L 31/0481 136/251 |
| 2010/0226839 A1* | 9/2010 | Lian | C22B 3/22 423/112 |

(Continued)

FOREIGN PATENT DOCUMENTS

| | | | |
|---|---|---|---|
| CN | 104201248 A | 12/2014 | |
| CN | 105057323 A | 11/2015 | |

(Continued)

OTHER PUBLICATIONS

Taiwanese Search Report for Taiwanese Application No. 109127681, dated Feb. 11, 2022, with English translation.

*Primary Examiner* — Golam Mowla
(74) *Attorney, Agent, or Firm* — Birch, Stewart, Kolasch & Birch, LLP

(57) ABSTRACT

A method for recovering a resource from a CIGS thin-film solar cell to be recycled includes a) providing the CIGS thin-film solar cell, and b) subjecting the CIGS thin-film solar cell to a cooling treatment at a predetermined temperature, such that a light absorbing unit of the CIGS thin-film solar cell can be recovered due to thermal strain difference of materials of the CIGS thin-film solar cell.

20 Claims, 7 Drawing Sheets

(51) Int. Cl.
*H01L 31/032* (2006.01)
*H01L 31/0445* (2014.01)
*B32B 43/00* (2006.01)
*C01G 15/00* (2006.01)
*C01G 3/02* (2006.01)
*B09B 3/80* (2022.01)

(52) U.S. Cl.
CPC ...... *C01G 15/00* (2013.01); *H01L 31/022425* (2013.01); *H01L 31/0322* (2013.01); *H01L 31/0445* (2014.12); *B32B 2310/0409* (2013.01); *B32B 2311/00* (2013.01); *B32B 2315/02* (2013.01); *B32B 2315/08* (2013.01); *B32B 2317/12* (2013.01); *B32B 2457/12* (2013.01)

(56) References Cited

U.S. PATENT DOCUMENTS

2010/0329970 A1* 12/2010 Lian .................. C22B 3/10
423/510
2013/0276885 A1* 10/2013 Chen ............... H01L 31/03923
438/57
2019/0382868 A1* 12/2019 Tan .................. C22B 7/001

FOREIGN PATENT DOCUMENTS

| | | |
|---|---|---|
| CN | 105886767 A | 8/2016 |
| CN | 108425015 A | 8/2018 |
| TW | 202000931 A | 1/2020 |
| WO | WO 2019/203026 A1 | 10/2019 |

* cited by examiner

METHOD FOR RECOVERING RESOURCE FROM CIGS THIN-FILM SOLAR CELL

CROSS-REFERENCE TO RELATED APPLICATION

This application claims priority of Taiwanese Invention Patent Application No. 109127681, filed on Aug. 14, 2020.

FIELD

The disclosure relates to a method for recovering a solar cell, and more particularly to a method for recovering a resource from a CIGS thin-film solar cell to be recycled.

BACKGROUND

Due to an increased awareness of environmental protection in recent years, "green energy" has become a focus of energy development, and solar cells are an important green energy source that has been actively developed by various countries in recent decades.

Solar cells for generating green energy, after being used for a period of time, may be scrapped due to adverse effects of external environment or material deterioration of the solar cells. Therefore, the amount of solar cell waste is estimated to greatly increase in the near future, and how to effectively recycle the discarded solar cells is another important issue in the development of solar cells.

Although the market share of copper indium gallium selenide thin-film solar cells (hereinafter referred as CIGS thin-film solar cells) is relatively small at present, the recycling of the discarded CIGS thin-film solar cells is meaningful and beneficial to the environment. For example, the metals used in the CIGS thin-film solar cells (i.e., Cu, In and Ga) may be recycled to be used in other technical fields, and since selenium is toxic, the toxicity thereof would adversely affect the environment if a proper recycling process is not being done. Conventionally, in order to recover the valuable metals contained in the solar cells, encapsulated materials for the solar cells might be removed by a heating treatment or using solvents. Otherwise, the solar cells as a whole might be fragmented into small pieces, followed by sorting the small pieces. However, these conventional methods might produce large amounts of waste gases, waste solvents, and so on, and the recycled metals may have a relatively high amount of impurities therein. Therefore, how to effectively recover a resource from the CIGS thin-film solar cells is also an important factor to be considered in the development of the CIGS thin-film solar cells.

SUMMARY

Therefore, an object of the disclosure is to provide a novel method for recovering a resource from a CIGS thin-film solar cell to be recycled, by which at least one of the drawbacks of the prior art may be alleviated or eliminated.

According to a first aspect of the disclosure, a method for recovering a resource from a CIGS thin-film solar cell to be recycled is provided. The method includes the steps of:

a) providing the CIGS thin-film solar cell which includes
  a front substrate,
  a light absorbing unit disposed rearwardly of the front substrate, and having a CIGS photovoltaic layer which includes copper, indium, gallium, and selenide,
  a first adhesive layer sandwiched between the front substrate and the light absorbing unit,
  a rear substrate unit disposed rearwardly of the light absorbing unit, and including at least one rear substrate and a second adhesive layer, and
  an electrical contact layer sandwiched between the light absorbing unit and the rear substrate unit, wherein a bonding force between the electrical contact layer and the light absorbing unit is smaller than a bonding force between the electrical contact layer and the rear substrate unit; and b) subjecting the CIGS thin-film solar cell to a cooling treatment at a predetermined temperature lower than a brittleness temperature of the second adhesive layer such that the light absorbing unit is separated from the electrical contact layer as a result of a thermal strain produced between the electrical contact layer and the rear substrate unit.

According to a second aspect of the disclosure, a method for recovering a resource from a CIGS thin-film solar cell to be recycled is provided. The method includes the steps of:

i) providing a light absorbing unit recovered from the CIGS thin-film solar cell, the recovered light absorbing unit having a CIGS photovoltaic layer which includes copper, indium, gallium, and selenide;

ii) subjecting the recovered light absorbing unit to an annealing treatment at a temperature ranging from 800° C. to 950° C. in an oxygen ambient to remove the selenide in the light absorbing unit, and to collect selenium oxide, thereby obtain an intermediate including oxides of copper, indium, and gallium;

iii) dissolving copper, indium, and gallium ions from the intermediate using an inorganic acid aqueous solution as a solvent so as to obtain a first acid solution including the copper, indium, and gallium ions; and iv) subjecting the first acid solution to extraction using di(2-ethylhexyl)phosphoric acid as an eluent whilst keeping aqueous phase pH value to be not greater than 1 so as to obtain a first organic phase solution including the indium ions, and a second acid solution including the copper and gallium ions.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
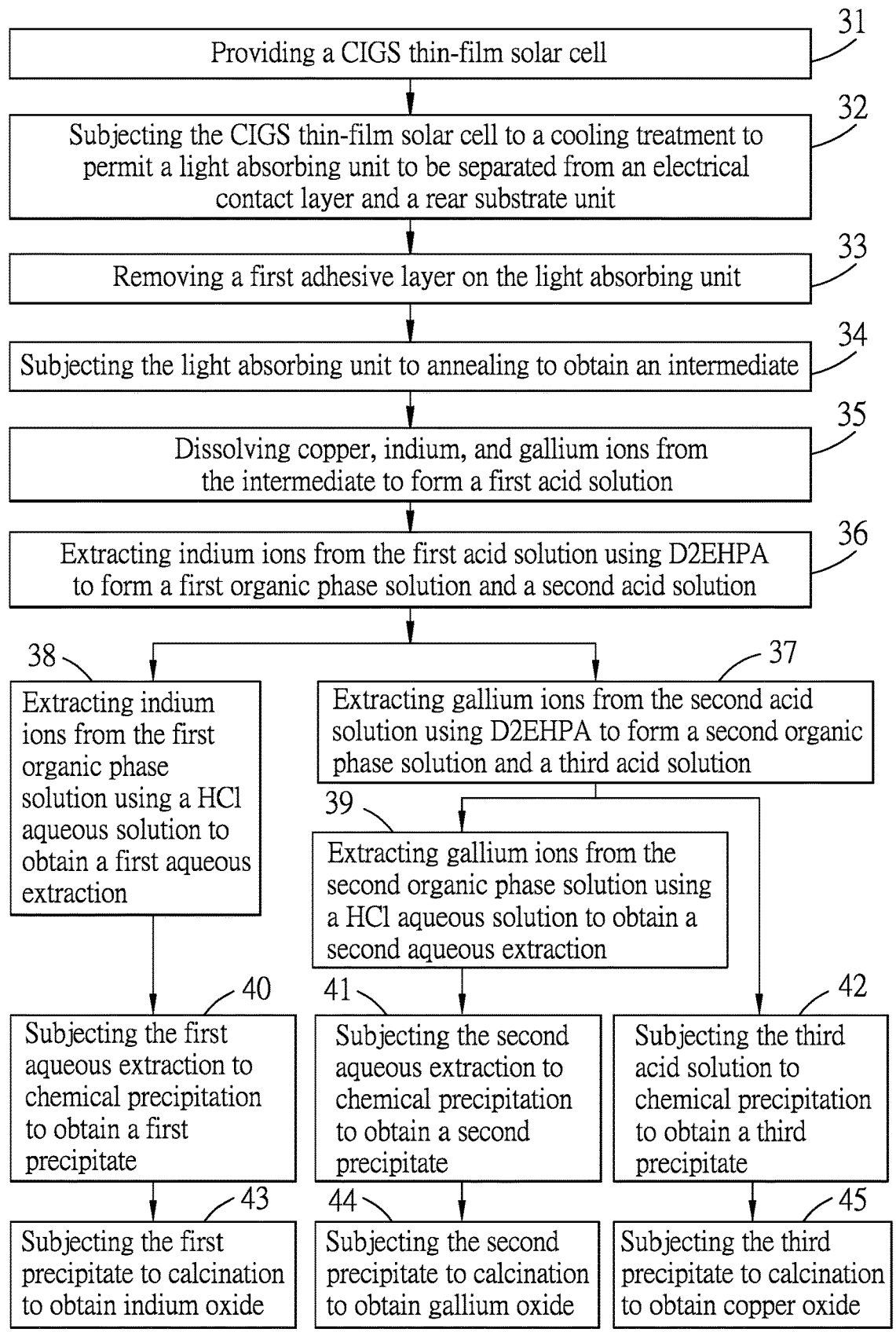
FIG. 1 is a flow diagram of a method for recovering a resource from a CIGS thin-film solar cell according to an embodiment of the disclosure.

Before the disclosure is described in greater detail, it should be noted that where considered appropriate, reference numerals have been repeated among the figures to indicate corresponding or analogous elements, which may optionally have similar characteristics.

To aid in describing the disclosure, directional terms may be used in the specification and claims to describe portions of the present disclosure (e.g., front, rear, left, right, top, bottom, etc.). These directional definitions are intended to merely assist in describing and claiming the disclosure and are not intended to limit the disclosure in any way.

FIG. 1 illustrates a flow diagram of a method for recovering a resource from a copper indium gallium selenide thin-film solar cell (hereinafter referred as CIGS thin-film solar cell) to be recycled according to an embodiment of the disclosure. The method is used to recover the CIGS thin-film solar cell obtained after removal of an aluminum frame, a power box, a power converter, and other components (not shown). The method includes steps 31 and 32.

Figure 2:
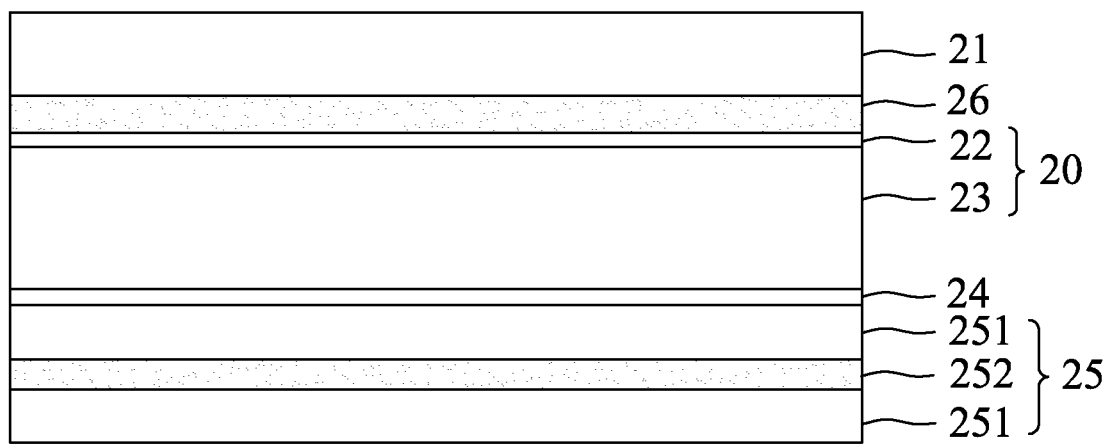
FIG. 2 is a schematic view of the CIGS thin-film solar cell.

In step 31, a CIGS thin-film solar cell shown in FIG. 2 is provided. It should be noted that the CIGS thin-film solar cell shown in FIG. 2, which is for illustrative purposes only, is not drawn to scale, and is not intended to represent the actual sizes or actual relative sizes of the components of the CIGS thin-film solar cell.

The CIGS thin-film solar cell may include a front substrate 21, a light absorbing unit 20, a first adhesive layer 26, a rear substrate unit 25, and an electrical contact layer 24.

The front substrate 21 is made of a light-transmissive material. In an embodiment, the front substrate 21 may be a glass substrate.

The light absorbing unit 20 is disposed rearwardly of the front substrate 21, and has a CIGS photovoltaic layer 23 which includes copper, indium, gallium, and selenide. In an embodiment shown in FIG. 2, the light absorbing unit 20 may further include a front electrode 22 which is made of transparent conductive oxide.

The first adhesive layer 26 is sandwiched between the front substrate 21 and the light absorbing unit 20. In an embodiment shown in FIG. 2, the first adhesive layer 26 is sandwiched between the front substrate 21 and the front electrode 22.

The rear substrate unit 25 is disposed rearwardly of the light absorbing unit 20, and includes at least one rear substrate 251 and a second adhesive layer 252. In an embodiment shown in FIG. 2, the rear substrate unit 25 may include two of the rear substrates 251, and the second adhesive layer 252 may be sandwiched between the rear substrates 251. The front one of the rear substrates 251 may be, for example, but is not limited to, a glass substrate, and the rear one of the rear substrates 251 may be a backboard. The backboard may be, for example, but is not limited to, a paper sheet.

The electrical contact layer 24 is sandwiched between the light absorbing unit 20 and the rear substrate unit 25. A bonding force between the electrical contact layer 24 and the light absorbing unit 20 is smaller than a bonding force between the electrical contact layer 24 and the rear substrate unit 25. In an embodiment, the electrical contact layer 24 may be made of molybdenum, and may serve as a rear electrode of the CIGS thin-film solar cell. Because the functions and configurations of the CIGS thin-film solar cell are well-known in the art, the details thereof are omitted herein for the sake of brevity.

In step 32, the CIGS thin-film solar cell is subjected to a cooling treatment at a predetermined temperature lower than a brittleness temperature of the second adhesive layer 252 such that the light absorbing unit 20 is separated from the electrical contact layer 24 as a result of a thermal strain produced between the electrical contact layer 24 and the rear substrate unit 25.

In an embodiment, the cooling treatment in step 32 may be implemented using a cooling medium selected from the group consisting of liquid nitrogen, liquid argon, liquid oxygen, liquid carbon dioxide, and combinations thereof.

In an embodiment, in step 32, the predetermined temperature is also lower than a brittleness temperature of the first adhesive layer 26 so as to reduce a viscosity of the first adhesive layer 26, thereby facilitating detachment of the front substrate 21 from the light absorbing unit 20.

In an embodiment, both the first and second adhesive layers 26, 252 are made of ethylene-vinyl acetate (EVA) which has a brittleness temperature ranging from 170K to 200K, and liquid nitrogen is used as the cooling medium to permit the predetermined temperature to reach to 77K in step 32.

In an embodiment shown in FIG. 1, the method may further include a step 33. In step 33, the first adhesive layer 26 is removed using a solvent so as to obtain the light absorbing unit 20 recovered from the CIGS thin-film solar cell. When the first adhesive layer 26 is made of EVA, and the solvent may be a diluted HCl aqueous solution having a concentration ranging from 0.1 mol/L to 1.2 mol/L.

In an embodiment, because the viscosity of the first adhesive layer 26 is reduced in step 32, the front substrate 21 can be easily removed from the light absorbing unit 20 with the first adhesive layer 26 adhering on the light absorbing unit 20, and the front substrate 21 may also be recycled. In step 33, the first adhesive layer 26, after rinsing using the solvent, can be easily peeled off from the light absorbing unit 20. In step 33 of the other embodiment, the light absorbing unit 20 may be separated from the top substrate 21 by immersing and dissolving the first adhesive layer 26 that is positioned between the light absorbing unit 20 and the front substrate 21, using the solvent.

Please note that in this embodiment, although the light absorbing unit 20 is recovered from the CIGS thin-film solar cell using steps 32 and 33, it may be recovered using any other conventional methods. For example, the CIGS thin-film solar cell may be subjected to a heating treatment at a temperature higher than pyrolysis temperatures of the first and second adhesive layers 26, 252. However, the heating treatment may consume a lot of energy and generate a large amount of waste gases. In addition, the heating treatment may cause diffusion of metals in the light absorbing unit 20, which renders recycling of such metals more complicated. On the other hand, if the light absorbing unit 20 is recovered from the CIGS thin-film solar cell using solvents, a large amount of waste liquids may be produced.

Because steps 32 and 33 do not involve a heating treatment, no waste gas will be produced, and the metal in the light absorbing unit 20 may not diffuse. Besides, because the first adhesive layer 26 has reduced viscosity and can be easily peeled off, the waste solvent produced in the step 33 may be present at a relatively small amount.

In an embodiment shown in FIG. 1, the method may further include steps 34 and 35 for further treating the recovered light absorbing unit 20 obtained using steps 32 and 33 or obtained using the conventional methods.

In step 34, the recovered light absorbing unit 20 is subjected to an annealing treatment at a temperature ranging from 800° C. to 950° C. in an oxygen ambient to remove the selenide in the light absorbing unit 20 and to collect selenium oxide, thereby obtaining an intermediate including oxides of copper, indium, and gallium. In step 34, chalcogen (e.g., sulfur), if any, in the light absorbing unit 20 may be also removed, and chalcogen oxide (e.g., sulfur dioxide), if any, may also be collected.

Figure 3:
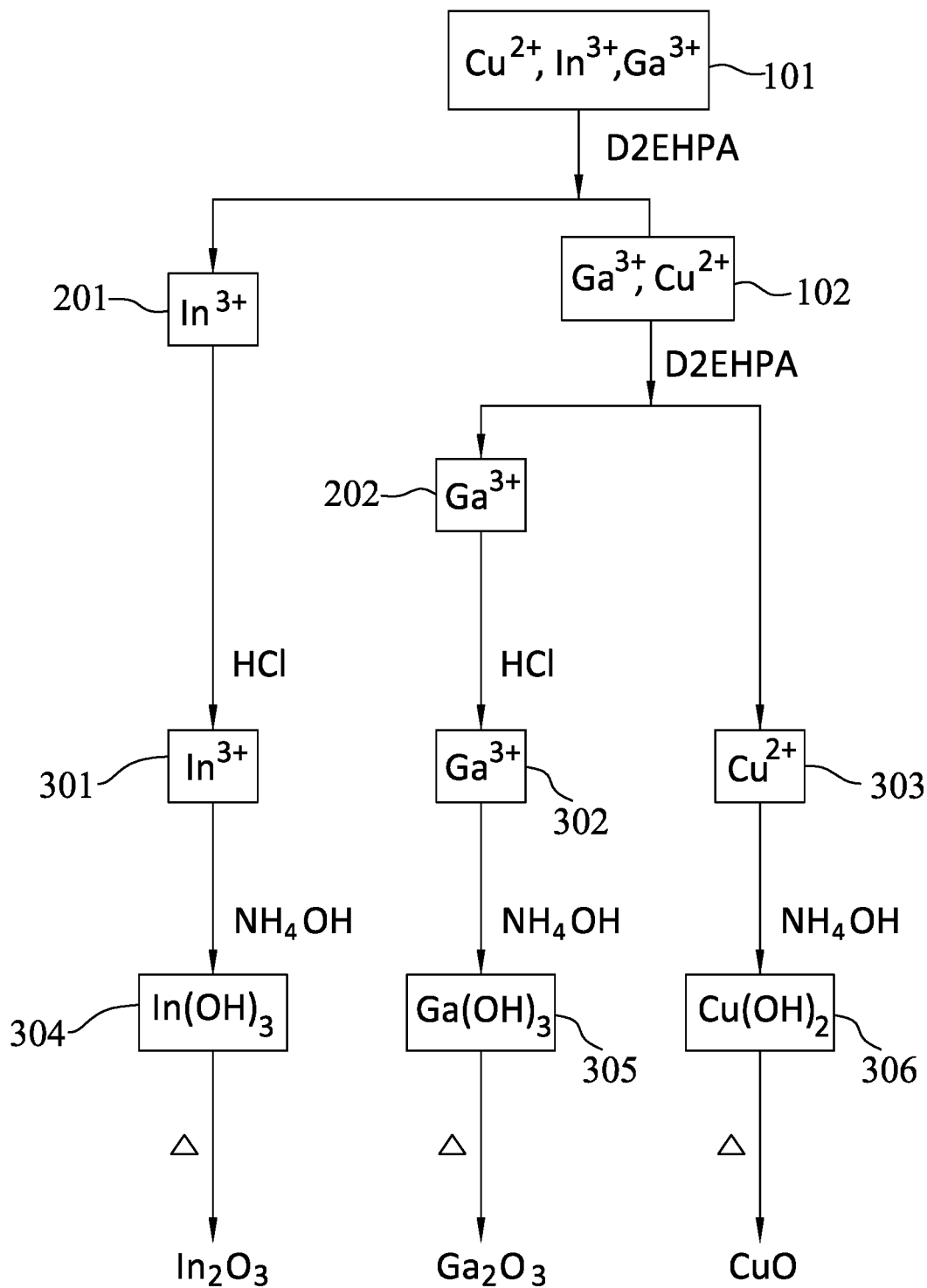
FIG. 3 is a flow diagram for further explanation of the method of the embodiment.

In step 35, copper ions ($Cu^{2+}$), indium ions ($In^{3+}$), and gallium ions ($Ga^{3+}$) are dissolved from the intermediate using an inorganic acid aqueous solution as a solvent, so as to obtain a first acid solution 101 including the copper, indium, and gallium ions (see FIG. 3). The inorganic acid aqueous solution may be a HCl aqueous solution, a $HNO_3$ aqueous solution, or a $H_2SO_4$ aqueous solution.

In an embodiment shown in FIGS. 1 and 3, the method may further include steps 36 to 39.

In step 36, the first acid solution 101 is subjected to extraction using di(2-ethylhexyl)phosphoric acid (D2EHPA) as an eluent whilst keeping aqueous phase pH value (i.e., pH value of the first acid solution 101) to be not greater than 1, so as to obtain a first organic phase solution 201 including the indium ions, and a second acid solution 102 including the copper and gallium ions.

Step 37 is implemented after step 36. In step 37, the second acid solution 102 is subjected to extraction using D2EHPA as an eluent whilst keeping aqueous phase pH value of the aqueous phase (i.e., pH value of the second acid solution 102) to be less than 7 and greater than 1, so as to obtain a second organic phase solution 202 including the gallium ions, and a third acid solution 303 including the copper ions.

Step 38 is implemented after step 36, and may be implemented before or after step 37. In step 38, the first organic phase solution 201 is subjected to extraction using a HCl aqueous solution as an eluent so as to obtain a first aqueous extraction 301 including the indium ions. In step 38, the HCl aqueous solution may have a concentration ranging from 0.1 mol/L to 4 mol/L, an aqueous-organic (A/O) ratio may range from 0.25 ml/ml to 4 ml/ml, and an extraction time may range from 0.1 minute to 15 minutes.

Step 39 is implemented after step 37. In step 39, the second organic phase solution 202 is subjected to extraction using a HCl aqueous solution as an eluent so as to obtain a second aqueous extraction 302 including the gallium ions. In step 39, the HCl aqueous solution may have a concentration ranging from 0.1 mol/L to 4 mol/L, an aqueous-organic (A/O) ratio may range from 0.25 ml/ml to 4 ml/ml, and an extraction time may range from 0.1 minute to 15 minutes.

In an embodiment shown in FIGS. 1 and 3, the method may further include steps 40 to 42.

Step 40 is implemented after step 38, and may be implemented before or after step 37. In step 40, the first aqueous extraction 301 is subjected to chemical precipitation using ammonium hydroxide ($NH_4OH$) as a precipitation reagent so as to obtain a first precipitate 304 including indium hydroxide [$In(OH)_3$].

Step 41 is implemented after step 39. In step 41, the second aqueous extraction 302 is subjected to chemical precipitation using ammonium hydroxide as a precipitation reagent so as to obtain a second precipitate 305 including gallium hydroxide [$Ga(OH)_3$].

Step 42 is implemented after step 37, and may be implemented before or after step 39. In step 42, the third acid solution 303 is subjected to chemical precipitation using ammonium hydroxide as a precipitation reagent so as to obtain a third precipitate 306 including copper hydroxide [$Cu(OH)_2$].

In an embodiment shown in FIGS. 1 and 3, the method may further include steps 43 to 45.

Step 43 is implemented after step 40, and may be implemented before or after step 37. In step 43, the first precipitate 304 is subjected to calcination so as to obtain indium oxide ($In_2O_3$).

Step 44 is implemented after step 41, and may be implemented before or after step 42. In step 44, the second precipitate 305 is subjected to calcination so as to obtain gallium oxide ($Ga_2O_3$).

Step 45 is implemented after step 42. In step 45, the third precipitate 306 is subjected to calcination so as to obtain copper oxide (CuO).

The embodiments of the disclosure will now be explained in more detail below by way of the following examples. Those examples are intended for purposes of illustration only and are not intended to limit the scope of the present disclosure.

EXAMPLE 1

A CIGS thin-film solar cell was prepared by cutting a panel from a commercial CIGS thin-film solar energy module (obtained from Eterbright Solar Corporation, size: 1234 mm×652 mm×35 mm), and was in a square shape (20 cm×20 cm). The cut panel had a configuration similar to that of the CIGS thin-film solar cell shown in FIG. 2, in which each of the front substrate 21 and the front one of the rear substrates 251 was a glass substrate, the rear one of the rear substrates 251 was a paper sheet, the electrical contact layer 24 was made of molybdenum, and each of the first and second adhesive layers 26, 252 was made of EVA.

The cut panel was immersed in liquid nitrogen having a temperature of 77K for about 1 minute. Thereafter, the light absorbing unit 20 was separated from the electrical contact layer 24. Then, the front substrate 21 was removed manually. The first adhesive layer 26, after rinsing with a diluted HCl aqueous solution (not greater than 1.2 mol/L), was peeled off from the light absorbing unit 20.

Then, the light absorbing unit 20 was annealed at 900° C. in an oxygen ambient for 4 hours to obtain an intermediate. After analyzing using an X-ray photoelectron spectroscopy (XPS, Ulvac-PHI, Versaprobe II), the intermediate was determined to include oxides of copper, indium, and gallium, and no selenium and sulfur was found therein.

The intermediate was immersed in a $HNO_3$ aqueous solution (5 mol/L) with a liquid-solid ratio of 50 for leaching out copper, indium, and gallium ions. The leaching process was conducted at 80° C. for 3 hours to obtain a first acid solution 101 (see FIG. 3).

To extract the copper, indium, and gallium ions from the first acid solution 101 obtained in Example 1, multiple samples of the first acid solution 101 were further prepared using the same procedures as those in Example 1 for the following experiments.

Experiment 1—Extraction at Different pH Values

The ions of the first acid solution 101 were extracted using D2EHPA in kerosene, whilst aqueous phase pH value was kept at a predetermined value. The aqueous phase pH values for six tests were varied from 0.5 to 2.5. In addition, in each test of Experiment 1, the D2EHPA concentration (0.05 mol/L), the A/O ratio (1 ml/ml), and extraction time (10 minutes) were not varied. The ion concentrations for each of the copper, indium, and gallium ions, before and after extraction, were analyzed using an ICP-OES (inductively coupled plasma optical emission spectroscopy) system (Varian, Vista-MPX). Extraction efficiency (Ee) for ions of each of the copper, indium, and gallium was calculated using a formula:

$$Ee = \left(1 - \frac{\text{ion concentration after extraction}}{\text{ion concentration before extraction}}\right) \times 100\%$$

Figure 4:
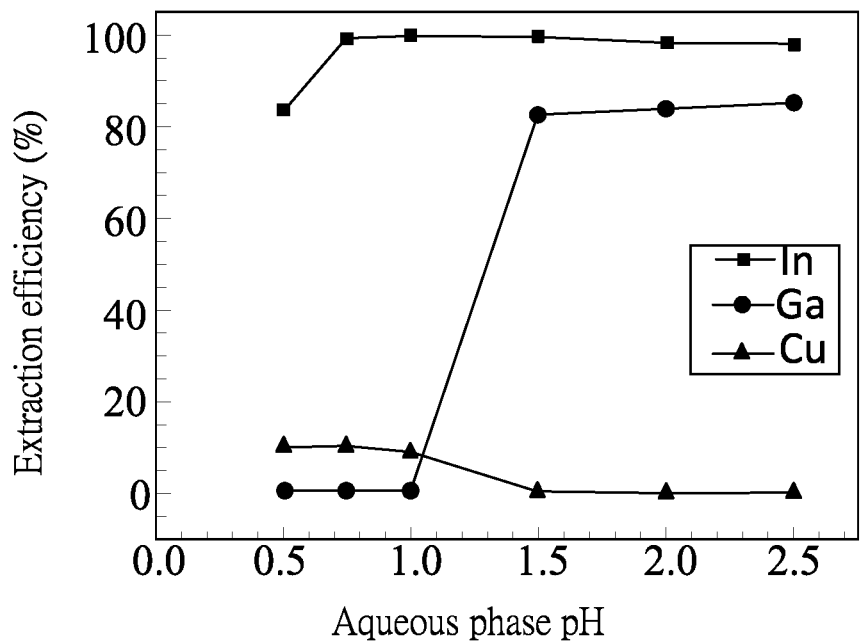
FIG. 4 is a plot illustrating effect of aqueous phase pH value on extraction efficiency of a ternary solution including copper, gallium, and indium ions.

The calculated results in FIG. 4 show that when aqueous phase pH is ≤1, the extraction efficiency for ions of each of the copper and gallium is poor (not greater than 15%) and the extraction efficiency for the indium ions can almost reach 100%, and that when aqueous phase pH is 1.5, the extraction efficiency for the gallium ions can be increased to over 80%. Therefore, when the aqueous phase pH value is controlled to be not greater than 1, the indium ions may be efficiently extracted from the first acid solution 101 using D2EHPA.

Experiment 2—Extraction at Different D2EHPA Concentrations

Figure 5:
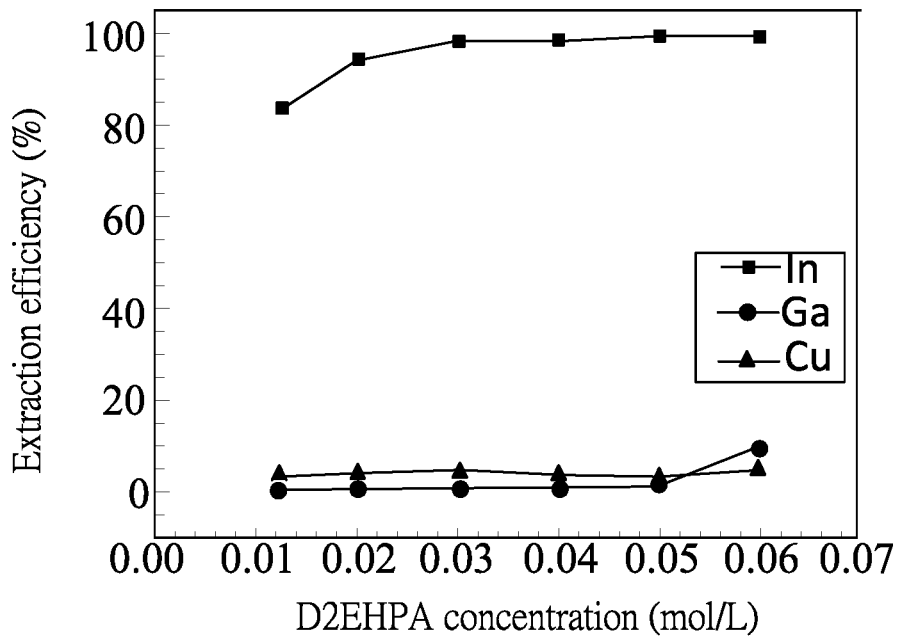
FIG. 5 is a plot illustrating effect of D2EHPA concentration on extraction efficiency of the ternary solution.

In Experiment 2, the ions of the first acid solution 101 were extracted according to the procedures and conditions similar to those of Experiment 1, except that in Experiment 2, the D2EHPA in kerosene for the six tests were added to the first acid solution 101 so as to have concentrations that vary from 0.01 mol/L to 0.06 mol/L. In addition, in each test of Experiment 2, aqueous phase pH value was kept at 1, an A/O ratio was controlled at 1 ml/ml, and extraction time was set to be 10 minutes. Similarly, ion concentration for each of the copper, indium, and gallium, before and after extraction, were analyzed using the ICP-OES system. The calculated results of extraction efficiency for ions of each of the copper, indium, and gallium are shown in FIG. 5. It can be found in FIG. 5 that when the D2EHPA concentration is greater than 0.03 mol/L, the extraction efficiency for the indium ions can almost reach 100% and the extraction efficiency for each of the copper and gallium ions is poor.

Experiment 3—Extraction at Different A/O Ratios

Figure 6:
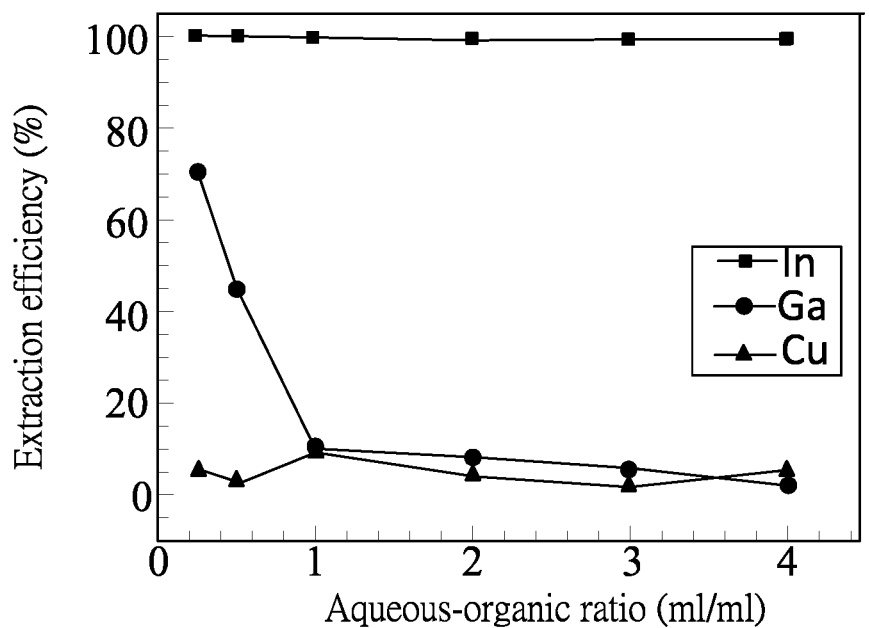
FIG. 6 is a plot illustrating effect of aqueous-organic ratio on extraction efficiency of the ternary solution.

The ions of the first acid solution 101 were extracted according to the procedures and conditions similar to those of Experiment 2 except that in the six test of Experiment 3, the A/O ratios were varied, and the D2EHPA concentration (0.05 mol/L), the aqueous phase pH value (pH=1), and the extraction time (10 minutes) were not varied. Similarly, ion concentrations for each of the copper, indium, and gallium, before and after extraction, were analyzed using the ICP-OES system. The calculated results of extraction efficiency for ions of each of the copper, indium, and gallium are shown in FIG. 6. It can be found in FIG. 6 that the A/O ratio may influence the extraction efficiency of the gallium ions, but not influencing the extraction efficiency of the indium ions.

Experiment 4—Extraction at Different Extraction Times

Figure 7:
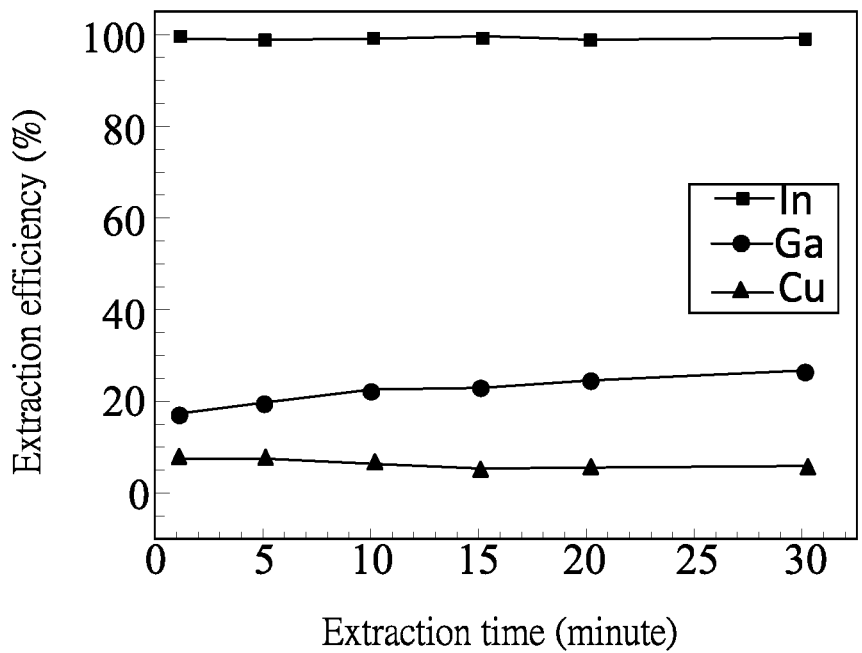
FIG. 7 is a plot illustrating effect of extraction time on extraction efficiency of the ternary solution.

The ions of the first acid solution 101 were extracted according to the procedures and conditions similar to those of Experiment 3, except that in the six tests for Experiment 4, the D2EHPA concentration (0.05 mol/L), the aqueous phase pH value (pH=1), and the A/O ratio (1 ml/ml) were not varied, and the extraction times were varied. Similarly, ion concentrations for each of the copper, indium, and gallium, before and after extraction, were analyzed using the ICP-OES system. The calculated results of extraction efficiency for ions of each of the copper, indium, and gallium are shown in FIG. 7. It can be found in FIG. 7 that the extraction time may not greatly influence the extraction efficiency for each of the copper, indium, and gallium ions.

EXAMPLE 2

In Example 2, the D2EHPA in kerosene was added to the first acid solution 101 obtained in Example 1 so as to have a concentration of 0.05 mol/L, the aqueous phase pH value was kept at 1, the A/O ratio was controlled at 1 ml/ml, the extraction time was 10 minutes, and the extraction efficiency of indium ions from the first acid solution 101 was greater than 99%. After extracting indium ions from the first acid solution 101, the first organic phase solution (D2EHPA phase) 201 including the indium ions, and the second acid solution (aqueous phase) 102 including the copper and gallium ions were obtained.

To extract the copper and gallium ions from the second acid solution 201, multiple samples of the second acid solutions 201 using the same procedures as those of Example 2 were further prepared for the following experiments.

Experiment 5—Extraction at Different pH Values

Figure 8:
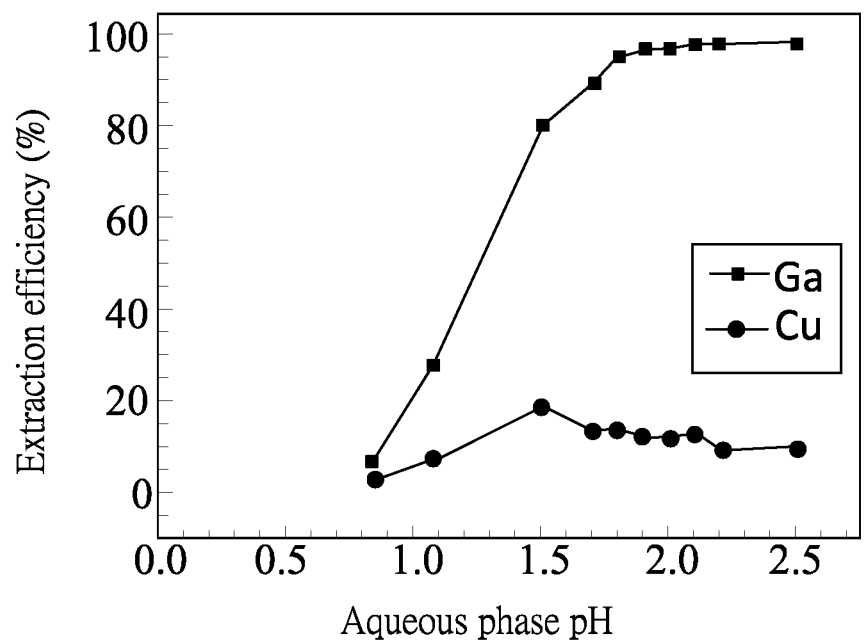
FIG. 8 is a plot illustrating effect of aqueous phase pH value on extraction efficiency of a binary solution including copper and gallium ions.

Experiment 5 was performed according to the similar procedures and conditions as those of Experiment 1, except that in Experiment 5, the second acid solution 102 obtained in Example 2 was subjected to extraction at different aqueous pH values. In addition, in each test of Experiment 5, the D2EHPA concentration (0.05 mol/L), the A/O ratio (1 ml/ml), and extraction time (10 minutes) were not varied. Ion concentrations for each of the copper and gallium, before and after extraction, were analyzed using the ICP-OES system. The calculated results of extraction efficiency for ions of each of the copper and gallium are shown in FIG. 8. It can be found in FIG. 8 that when aqueous phase pH≥2, the extraction efficiency for the gallium ions can almost reach 100%.

Experiment 6—Extraction at Different D2EHPA Concentrations

Figure 9:
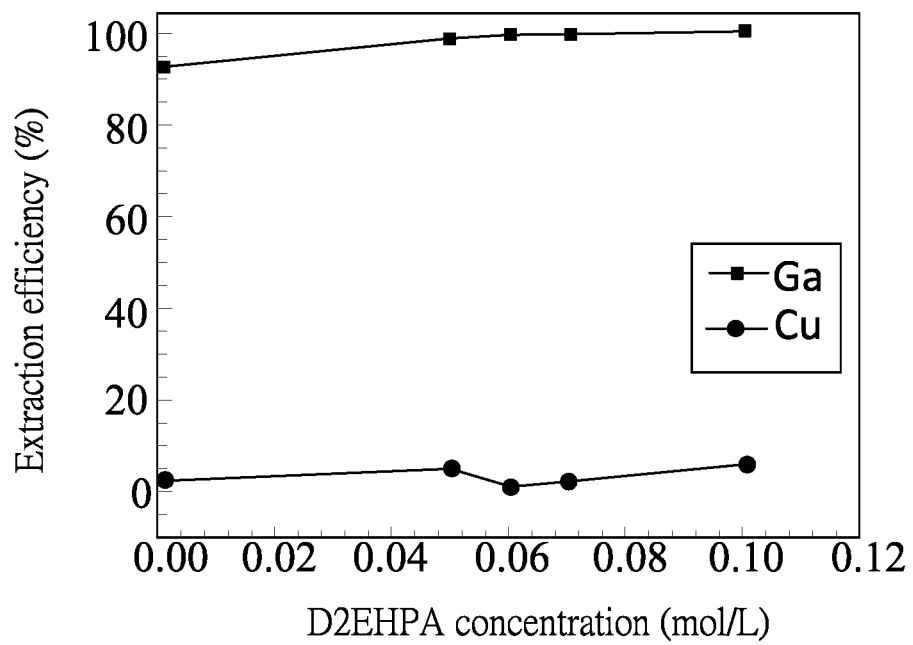
FIG. 9 is a plot illustrating effect of D2EHPA concentration on extraction efficiency of the binary solution.

Experiment 6 was performed according to the similar procedures and conditions as those of Experiment 2, except that in Experiment 6, the second acid solution 102 was subjected to extraction, and the D2EHPA in kerosene for the five tests were added to the second acid solution 102 so as to have different concentrations. In addition, the aqueous phase pH value was kept at 2, the A/O ratio was controlled at 1 ml/ml, and the extraction time was set to be 5 minutes. Similarly, ion concentrations for each of the copper and gallium, before and after extraction, were analyzed using the ICP-OES system. The calculated results of extraction efficiency for ions of each of the copper and gallium are shown in FIG. 9. It can be found in FIG. 9 that when the D2EHPA concentration is 0.06 mol/L, the extraction efficiency for the gallium ions can almost reach 100%, and the extraction efficiency for the copper ions is close to zero.

Experiment 7—Extraction at Different A/O Ratios

Figure 10:
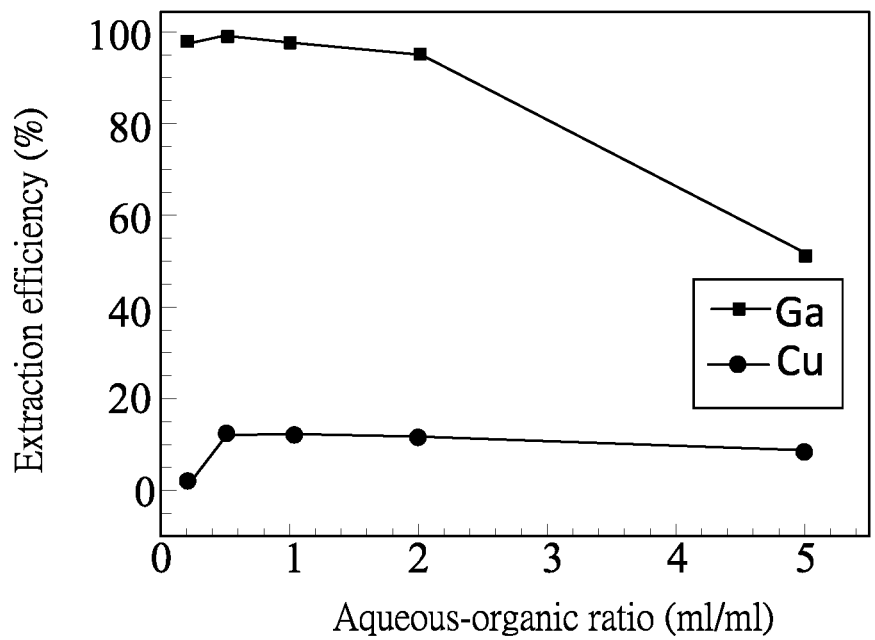
FIG. 10 is a plot illustrating effect of aqueous-organic ratio on extraction efficiency of the binary solution.

Experiment 7 was performed according to the similar procedures and conditions as those of Experiment 3, except that in Experiment 7, the second acid solution 102 was subjected to extraction at different A/O ratios. In addition, in each test of Experiment 7, the D2EHPA concentration (0.05 mol/L), the aqueous phase pH value (pH=2), and extraction time (10 minutes) were not varied. Similarly, ion concentrations for each of the copper and gallium, before and after extraction, were analyzed using the ICP-OES system. The calculated results of extraction efficiency for ions of each of the copper and gallium are shown in FIG. 10. It can be found in FIG. 10 that with an increase of the A/O ratio, the extraction efficiency for the gallium ions greatly decreases.

Experiment 8—Extraction at Different Extraction Times

Figure 11:
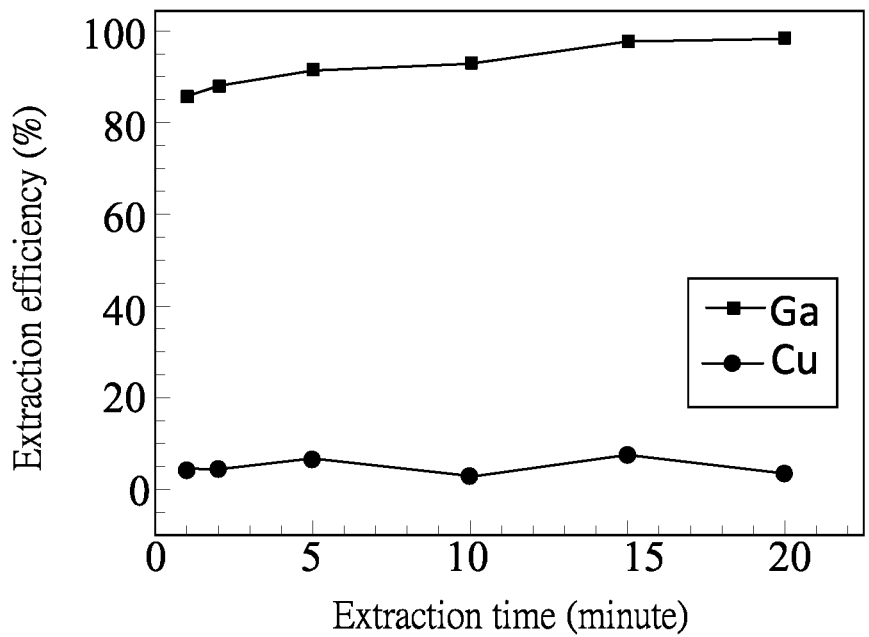
FIG. 11 is a plot illustrating effect of extraction time on extraction efficiency of the binary solution.

Experiment 8 was performed according to the similar procedures and conditions as those of Experiment 4, except that in Experiment 8, the second acid solution 102 was subjected to extraction at different extraction times. In addition, in each test of Experiment 8, the D2EHPA concentration (0.05 mol/L), the aqueous phase pH value (pH=2), and the A/O ratio (1 ml/ml) were not varied. Similarly, ion concentrations for each of the copper and gallium, before and after extraction, were analyzed using the ICP-OES system. The calculated results of extraction efficiency for ions of each of the copper and gallium are shown in FIG. 11. It can be found in FIG. 11 that the extraction may have better selectivity to the gallium ions when the extraction time was set to be 10 minutes.

EXAMPLE 3

In Example 3, the D2EHPA in kerosene was added to the second acid solution 102 obtained in Example 2 so as to have a concentration of 0.05 mol/L, the aqueous phase pH value was kept at 2, the A/O ratio was controlled at 1 ml/ml, the extraction time was 10 minutes, and the extraction efficiency of the gallium ions from the second acid solution 102 was greater than 99%. After extracting gallium ions from the second acid solution 102, a second organic phase solution (D2EHPA) 202 including the gallium ions, and a third acid solution 303 including the copper ions were obtained (see FIG. 3).

Next, the first organic phase solution 201 obtained in Example 2 was extracted using a HCl aqueous solution (2 mol/L) with an A/O ratio of 1 ml/ml to obtain a first aqueous extraction 301 including the indium ions. Similarly, the second organic phase solution 202 was extracted using a HCl aqueous solution (1 mol/L) with an A/O ratio of 1 ml/ml to obtain a second aqueous extraction 302 including the gallium ions.

Thereafter, an ammonium hydroxide solution (12 mol/L) was added dropwise into the first aqueous extraction 301 to adjust the pH value to 10, followed by filtration using a filter paper to collect a first precipitate 304. The first precipitate 304, analyzed using a thermogravimetric analyzer (TGA, METTLER TOLEDO, TGA/DSC 1), was found to dehydrate at about 400° C., and thus confirmed to be indium hydroxide [$In(OH)_3$].

Similarly, an ammonium hydroxide solution (12 mol/L) was added dropwise into the second aqueous extraction 302 to adjust the pH value to 5, followed by filtration using a filter paper to collect a second precipitate 305. The second precipitate 305, analyzed using the TGA, was found to dehydrate at about 500° C., and thus confirmed to be gallium hydroxide [$Ga(OH)_3$].

Further, an ammonium hydroxide solution (12 mol/L) was added dropwise into the third acid solution 303 to adjust the pH value to 8, followed by filtration using a filter paper to collect a third precipitate 306. The third precipitate 306, analyzed using the TGA, was found to dehydrate at about 600° C., and thus confirmed to be copper hydroxide [$Cu(OH)_2$].

Afterward, the first, second, and third precipitates 304, 305, 306 were calcined (1000° C.) to obtain a first solid, a second solid, and a third solid, respectively.

The first solid was analyzed using an X-ray diffraction (XRD, Dandong, DX-2700) and was confirmed to be indium oxide ($In_2O_3$). After analyzing the first solid using the XPS, a binding energy of 444.3 eV (In 3d5) was found, and the first solid was further confirmed to be indium oxide ($In_2O_3$). The weight percent for each metal element in the first solid was analyzed using the ICP-OES system, and the result is shown in Table 1.

The second solid was analyzed using the XRD and was confirmed to be gallium oxide ($Ga_2O_3$). After analyzing the second solid using the XPS, a binding energy of 1117.8 eV (Ga 2p3) was found, and the second solid was further confirmed to be gallium oxide ($Ga_2O_3$). The weight percent for each metal element in the second solid was analyzed using the ICP-OES system, and the result is shown in Table 1.

The third solid was analyzed using the XRD and was confirmed to be copper oxide (CuO). After analyzing the second solid using the XPS, a binding energy of 933.6 eV (Cu 2p3) was found, and the third solid was further confirmed to be copper oxide (CuO). The weight percent for each metal element in the third solid was analyzed using the ICP-OES system, and the result is shown in

TABLE 1

| Solid | Target metal | Metal content (wt %) | | | | R rate* (%) |
|---|---|---|---|---|---|---|
| | | Cu | In | Ga | Na | |
| CuO | Cu | 99.46 | 0 | 0.01 | 0.53 | 88.9 |
| $In_2O_3$ | In | 0.09 | 99.65 | 0.23 | 0.03 | 98.2 |
| $Ga_2O_3$ | Ga | 0.82 | 0.02 | 99.02 | 0.14 | 97.1 |

*Recovery rate = $\left(\dfrac{A}{B}\right) \times 100\%$ where

A is an actual weight of the target metal recovered from the CIGS thin-film solar cell, and B is a theoretical weight of the target metal in the CIGS thin-film solar cell.

In sum, with the provision of the method of the disclosure, a light absorbing unit 20 including copper, indium, gallium, and selenide may be easily recovered from a CIGS thin-film solar cell, and the copper, indium, and gallium may be effectively recycled in high purities.

In the description above, for the purposes of explanation, numerous specific details have been set forth in order to provide a thorough understanding of the embodiment(s). It will be apparent, however, to one skilled in the art, that one or more other embodiments maybe practiced without some of these specific details. It should also be appreciated that reference throughout this specification to "one embodiment," "an embodiment," an embodiment with an indication of an ordinal number and so forth means that a particular feature, structure, or characteristic maybe included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for recovering a resource from a CIGS thin-film solar cell to be recycled, the method comprising steps of:
   a) providing the CIGS thin-film solar cell which includes
      a front substrate,
      a light absorbing unit disposed rearwardly of the front substrate, and having a CIGS photovoltaic layer which includes copper, indium, gallium, and selenide,
      a first adhesive layer sandwiched between the front substrate and the light absorbing unit,
      a rear substrate unit disposed rearwardly of the light absorbing unit, and including at least one rear substrate and a second adhesive layer, and
      an electrical contact layer sandwiched between the light absorbing unit and the rear substrate unit, wherein a bonding force between the electrical contact layer and the light absorbing unit is smaller than a bonding force between the electrical contact layer and the rear substrate unit; and
   b) subjecting the CIGS thin-film solar cell to a cooling treatment at a predetermined temperature lower than a brittleness temperature of the second adhesive layer such that the light absorbing unit is separated from the electrical contact layer as a result of a thermal strain produced between the electrical contact layer and the rear substrate unit.

2. The method according to claim 1, wherein, in step b), the predetermined temperature is also lower than a brittleness temperature of the first adhesive layer so as to reduce a viscosity of the first adhesive layer, thereby facilitating detachment of the front substrate from the light absorbing unit.

3. The method according to claim 2, wherein the electrical contact layer is made of molybdenum.

4. The method according to claim 1, after step b), further comprising a step of
   c) removing the first adhesive layer using a solvent so as to obtain the light absorbing unit that is recovered from the CIGS thin-film solar cell.

5. The method according to claim 4, wherein the first adhesive layer is made of ethylene-vinyl acetate, and the solvent is a diluted HCl aqueous solution having a concentration ranging from 0.1 mol/L to 1.2 mol/L.

6. The method according to claim 4, after step c), further comprising a step of
   d) subjecting the recovered light absorbing unit to an annealing treatment at a temperature ranging from 800° C. to 950° C. in an oxygen ambient so as to remove the selenide in the light absorbing unit and to collect selenium oxide, thereby obtaining an intermediate including oxides of copper, indium, and gallium.

7. The method according to claim 6, after step d), further comprising a step of
   e) dissolving copper, indium, and gallium ions from the intermediate using an inorganic acid aqueous solution as a solvent so as to obtain a first acid solution including the copper, indium, and gallium ions.

8. The method according to claim 7, further comprising a step of
   f) subjecting the first acid solution to extraction using di(2-ethylhexyl)phosphoric acid as an eluent whilst keeping aqueous phase pH value to be not greater than 1 so as to obtain a first organic phase solution including the indium ions, and a second acid solution including the copper and gallium ions.

9. The method according to claim 8, further comprising a step of
   g) subjecting the second acid solution to extraction using di(2-ethylhexyl)phosphoric acid as an eluent whilst keeping aqueous phase pH value to be less than 7 and greater than 1 so as to obtain a second organic phase solution including the gallium ions, and a third acid solution including the copper ions.

10. The method according to claim 9, further comprising steps of:
    h) subjecting the first organic phase solution to extraction using a HCl aqueous solution as an eluent so as to obtain a first aqueous extraction including the indium ions; and
    i) subjecting the second organic phase solution to extraction using a HCl aqueous solution as an eluent so as to obtain a second aqueous extraction including the gallium ions.

11. The method according to claim 10, further comprising steps of:
    j) subjecting the first aqueous extraction to chemical precipitation using ammonium hydroxide as a precipitation reagent so as to obtain a first precipitate including indium hydroxide;
    k) subjecting the second aqueous extraction to chemical precipitation using ammonium hydroxide as a precipitation reagent so as to obtain a second precipitate including gallium hydroxide; and
    l) subjecting the third acid solution to chemical precipitation using ammonium hydroxide as a precipitation reagent so as to obtain a third precipitate including copper hydroxide.

12. The method according to claim 10, further comprising steps of:
    m) subjecting the first precipitate to calcination so as to obtain indium oxide;
    n) subjecting the second precipitate to calcination so as to obtain gallium oxide; and
    o) subjecting the third precipitate to calcination so as to obtain copper oxide.

13. The method according to claim 1, wherein, in step b), the cooling treatment is implemented using a cooling medium selected from the group consisting of liquid nitrogen, liquid argon, liquid oxygen, liquid carbon dioxide, and combinations thereof.

14. A method for recovering a resource from a CIGS thin-film solar cell to be recycled, the method comprising steps of:
   i) providing a light absorbing unit recovered from the CIGS thin-film solar cell, the recovered light absorbing unit having a CIGS photovoltaic layer which includes copper, indium, gallium, and selenide;
   ii) subjecting the recovered light absorbing unit to an annealing treatment at a temperature ranging from 800° C. to 950° C. in an oxygen ambient to remove the selenide in the light absorbing unit and to collect selenium oxide, thereby obtaining an intermediate including oxides of copper, indium, and gallium;
   iii) dissolving copper, indium, and gallium ions from the intermediate using an inorganic acid aqueous solution as a solvent so as to obtain a first acid solution including the copper, indium, and gallium ions; and
   iv) subjecting the first acid solution to extraction using di(2-ethylhexyl)phosphoric acid as an eluent whilst keeping aqueous phase pH value to be not greater than 1 so as to obtain a first organic phase solution including the indium ions, and a second acid solution including the copper and gallium ions.

15. The method according to claim 14, before step i), further comprising steps of:
   i-1) providing the CIGS thin-film solar cell which includes
      a front substrate,
      the light absorbing unit disposed rearwardly of the front substrate,
      a first adhesive layer sandwiched between the front substrate and the light absorbing unit,
      a rear substrate unit disposed rearwardly of the light absorbing unit, and including at least one rear substrate and a second adhesive layer, and
      an electrical contact layer sandwiched between the light absorbing unit and the rear substrate unit, wherein a bonding force between the electrical contact layer and the light absorbing unit is smaller than a bonding force between the electrical contact layer and the rear substrate unit;
   i-2) subjecting the CIGS thin-film solar cell to a cooling treatment at a predetermined temperature lower than a brittleness temperature of the second adhesive layer such that the light absorbing unit is separated from the electrical contact layer as a result of a thermal strain produced between the electrical contact layer and the rear substrate unit; and
   i-3) removing the first adhesive layer using a solvent so as to obtain the recovered light absorbing unit.

16. The method according to claim 14, further comprising a step of
   v) subjecting the second acid solution to extraction using di(2-ethylhexyl)phosphoric acid as an eluent whilst keeping aqueous phase pH value to be less than 7 and greater than 1 so as to obtain a second organic phase solution including the gallium ions, and a third acid solution including the copper ions.

17. The method according to claim 16, further comprising steps of:
   vi) subjecting the first organic phase solution to extraction using a HCl aqueous solution as an eluent so as to obtain a first aqueous extraction including the indium ions; and
   vii) subjecting the second organic phase solution to extraction using a HCl aqueous solution as an eluent so as to obtain a second aqueous extraction including the gallium ions.

18. The method according to claim 17, further comprising steps of:
   viii) subjecting the first aqueous extraction to chemical precipitation using ammonium hydroxide as a precipitation reagent so as to obtain a first precipitate including indium hydroxide;
   ix) subjecting the second aqueous extraction to chemical precipitation using ammonium hydroxide as a precipitation reagent so as to obtain a second precipitate including gallium hydroxide; and
   x) subjecting the third acid solution to chemical precipitation using ammonium hydroxide as a precipitation reagent so as to obtain a third precipitate including copper hydroxide.

19. The method according to claim 18, further comprising steps of:
   xi) subjecting the first precipitate to calcination so as to obtain indium oxide;
   xii) subjecting the second precipitate to calcination so as to obtain gallium oxide;
   xiii) subjecting the third precipitate to calcination so as to obtain copper oxide.

20. The method according to claim 15, wherein, in step i-2), the cooling treatment is implemented using a cooling medium selected from the group consisting of liquid nitrogen, liquid argon, liquid oxygen, liquid carbon dioxide, and combinations thereof.

* * * * *